(12) United States Patent
Ueno et al.

(10) Patent No.: US 6,577,188 B2
(45) Date of Patent: Jun. 10, 2003

(54) VARIABLE GAIN AMPLIFIER

(75) Inventors: Takashi Ueno, Kawasaki (JP); Tadashi Arai, Yokohama (JP); Takafumi Yamaji, Yokohama (JP); Hiroshi Yoshida, Yokohama (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/200,405

(22) Filed: Jul. 23, 2002

(65) Prior Publication Data

US 2002/0180520 A1 Dec. 5, 2002

Related U.S. Application Data

(62) Division of application No. 09/970,936, filed on Oct. 5, 2001, now Pat. No. 6,437,643.

(30) Foreign Application Priority Data

| Oct. 6, 2000 | (JP) | ......................................... 2000-308095 |
| Aug. 31, 2001 | (JP) | ......................................... 2001-262666 |

(51) Int. Cl.[7] ................................................. H03F 1/36
(52) U.S. Cl. .............................. 330/85; 330/86; 330/282
(58) Field of Search ........................... 330/85, 86, 282, 330/281, 141

(56) References Cited

U.S. PATENT DOCUMENTS

| 3,969,680 | A | * | 7/1976 | Wermuth ...................... 330/29 |
| 5,245,297 | A | * | 9/1993 | Claydon et al. ............. 330/129 |
| 5,266,905 | A | * | 11/1993 | Johnson ........................ 330/85 |
| 6,028,496 | A | * | 2/2000 | Ko et al. ...................... 333/214 |
| 6,501,255 | B2 | * | 12/2002 | Pomeroy ...................... 232/312 |

* cited by examiner

Primary Examiner—Henry Choe
(74) Attorney, Agent, or Firm—Oblon, Spivak, McClelland, Maier & Neustadt, P.C.

(57) ABSTRACT

A variable gain amplifier comprises a main amplifier circuit whose gain is controllable and which amplifies a difference signal between an input signal and a feedback signal, a feedback amplifier circuit whose gain is controllable and which amplifies an output signal of the main amplifier circuit, and a gain control circuit which complementarily control the gain of the main amplifier circuit and the gain of the feedback amplifier circuit.

20 Claims, 6 Drawing Sheets

VARIABLE GAIN AMPLIFIER

CROSS-REFERENCE TO RELATED APPLICATIONS

This application is based upon and claims the benefit of priority from the prior Japanese Patent Applications No. 2000-308095, filed Oct. 6, 2000; and No. 2001-262666, filed Aug. 31, 2001, the entire contents of both of which are incorporated herein by reference.

BACKGROUND OF THE INVENTION

1. Field of the Invention

The present invention relates to a variable gain amplifier used by a cable or radio communication or a magnetic recorder, and more particularly relates to a variable gain amplifier having dc-offset cancel function.

2. Description of the Related Art

Generally, in many amplifiers, it does not avoid that a dc-offset which is error components of bias voltage and bias current occurs in an output side of the amplifier.

In prior art, various methods are taken in order to cancel the dc-offset.

According to the conventional system for canceling the dc-offset of the amplifier, low frequency component to be near to dc is removed from the output signal of the main amplifier circus by a feedback amplifier circuit. The frequency component is fed back to the input of the main amplifier circuit. Thus, the dc-offset is removed in the input port of the main amplifier circuit.

The feedback amplifier circuit includes an integrator. The integrator amplifies the dc-components, but does not amplify ac-components.

The amplifier circuit having a fixed voltage gain can cancel dc-offset. However, in a variable gain amplifier circuit, the variation of gain brings about a change of offset. Since the amplifier includes an integrator, a long time requires until the transient influence of the gain variation is removed. As a result, there is problem to make signal quality deteriorate over long hour.

As described above, the conventional offset cancel system for canceling the offset using a feedback amplifier circuit includes the following problems. In other words, when the main amplifier circuit comprises a variable amplifier and the gain varies, the offset drift cannot follow a change of gain promptly. As a result, the signal quality has deteriorated over comparatively long hour.

BRIEF SUMMARY OF THE INVENTION

It is an object of the present invention to provide a variable gain amplifier wherein the good offset cancel that the offset does not fluctuates even if gain varies is possible.

According to a first aspect of the present invention, there is provided a variable gain amplifier receiving an input signal and outputting an output signal, comprising a main amplifier circuit whose gain is controllable and which amplifies a difference signal between the input signal and a feedback signal corresponding to the output signal and outputs the output signal, a feedback amplifier circuit whose gain is controllable, the feedback amplifier circuit configured to amplify the output signal and generate the feedback signal; and a gain control circuit which complementarily controls the gain of the main amplifier circuit and the gain of the feedback amplifier circuit.

According to a second aspect of the present invention, there is provided a variable gain amplifier apparatus, comprising: a plurality of variable gain amplifiers connected in cascade, each of the variable gain amplifiers including a main amplifier circuit whose gain is controllable and which amplifies a difference signal between an input signal and a feedback signal, and a feedback amplifier circuit whose gain is controllable and which amplifies an output signal of the amplifier apparatus and outputs the feedback signal; and a gain control circuit configured to supply a gain control signal to each of the variable gain amplifiers and complementarily control the gain of the main amplifier circuit and the gain of the feedback amplifier circuit according to the gain control signal, the gain control circuit setting a given delay time between the gain control signal supplying to a pre-stage one of the variable gain amplifiers and that to a rear-stage one thereof.

DETAILED DESCRIPTION OF THE INVENTION

There will now be described in detail an embodiment of the present invention in conjunction with the drawings.

First Embodiment

Figure 1:
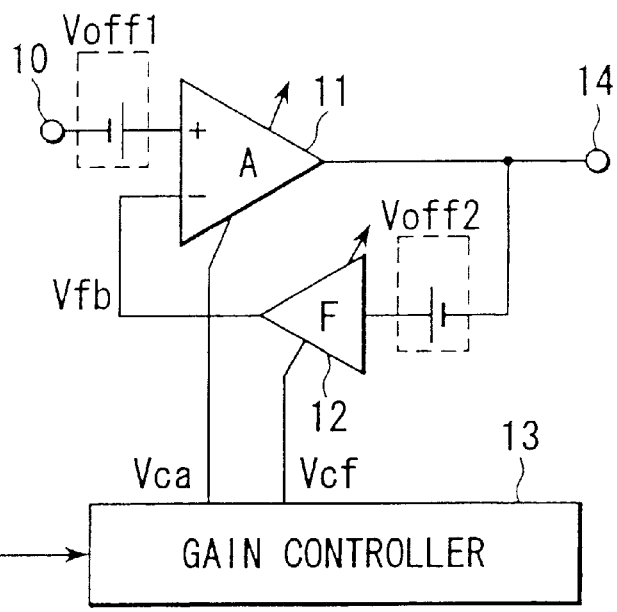
FIG. 1 shows a configuration of a variable gain amplifier related to the first embodiment of the present invention.

FIG. 1 shows a variable gain amplifier according to the first embodiment of the present invention.

This variable gain amplifier comprises a variable gain main amplifier circuit 11, a variable gain feedback amplifier circuit 12, and a gain control circuit 13 which controls the main amplifier circuit 11 and feedback amplifier circuit 12.

When the variable gain amplifier is applied to an radio communication apparatus, a gain control signal Vcont is supplied to the gain control circuit 13 by a signal processor. The amplification means a gain indicating more than zero (dB).

An input signal is supplied to a non-inverting input of the main amplifier circuit 11 from an input terminal 10. Marking Voff1 interposed between the input terminal 10 and the non-inverting input of the main amplifier circuit 11 indicates an input conversion offset of the main amplifier circuit 11, but not an actual circuit.

The output signal of the main amplifier circuit 11 is led to an output terminal 14 and supplied to the input of the feedback amplifier circuit 12. The output signal of the feedback amplifier circuit 12 is input to the inverted input of the main amplifier circuit 11 as feedback signal. The gain A of the main amplifier circuit 11 and the gain F of the feedback amplifier circuit 12 are complementarily controlled by the gain control signals Vca and Vcf supplied by the gain control circuit 13. In other words, when the gain A of the main amplifier circuit 11 is increased, the gain F of the feedback amplifier circuit 12 is decreased.

On the contrary, when the gain A of the main amplifier circuit 11 is decreased, the gain of the feedback amplifier circuit 12 is increased. For example, the gains F and A are controlled to make a product of F and A, that is, an open loop gain of the whole variable gain amplifier to be constant.

As described above, in the variable gain amplifier having a conventional offset cancellation function, the gain of the main amplifier circuit is variable, but the gain of the feedback amplifier circuit is fixed. For this reason, when the gain A of the main amplifier circuit varies, the feedback signal Vfb=F*A*Voff1/(1+F*A) varies depending on a change of the gain A. This transient response causes deterioration of signal quality as an offset drift.

In the variable gain amplifier according to the present embodiment, when the gain A of the main amplifier circuit 11 is changed, the gain F of the feedback amplifier circuit 12 is changed, too. For example, if the gain product F*A is kept at a constant value, it is possible to prevent the feedback signal (Vfb=F*A*Voff1/(1+F*A)) from being varied, even if the gain A of the main amplifier circuit 11 varies. Therefore, the transient response of an output error Δ gets possible to be made small. Concretely, it is thought that the gain A of the main amplifier circuit 11 be varied from 1 (0 dB) to 100 (40 dB).

In the present embodiment, the gain F of the feedback amplifier circuit 12 and the gain A of the main amplifier circuit 11 are complementarily varied. In other words, the gains F and A are complementarily varied from 100 (40 dB) to 1 (0 dB). Accordingly, even if the gain A of the main amplifier circuit 11 is varied from 1 (0 dB) to 100 (40 dB) as the conventional art, if the gain F of the feedback amplifier circuit 12 is fixed, the feedback signal represented by the equation (1) varies with a change of the gain A.

$$Vfb=F*A*Voff1/(1+F*A) \quad (1)$$

For this reason, the output error Δ shown in the equation (2) varies (1/11)Voff1 to (100/1001) Voff1.

$$\Delta=A*Voff1/(1+F*A) \quad (2)$$

However, when the gain control circuit 13 operates so that F*A is kept at a constant value, even if the gain A varies, the output error Δ does not vary.

When it is supposed that F*A=100 is fixed, for example, the transient response of the error Δ can be lowered. As a result, deterioration of output signal quality can be avoided.

Figure 2:
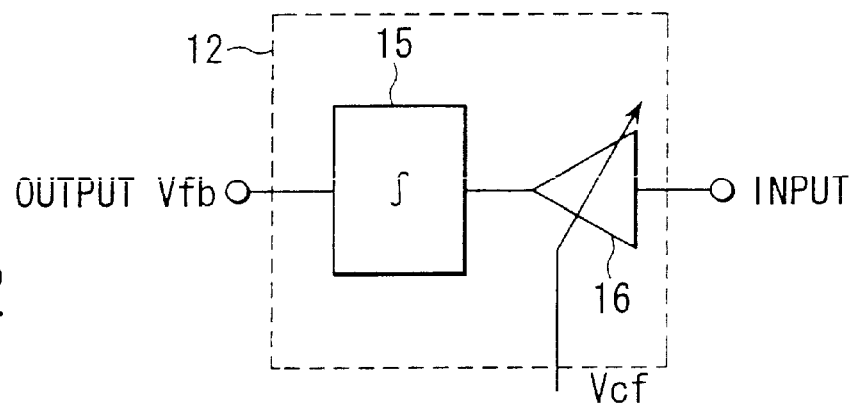
FIG. 2 shows a configuration of a feedback amplifier circuit.

FIG. 2 shows a configuration of the feedback amplifier circuit 12. An integrator 15 which amplifies a DC component but does not amplify an AC component (in other words, the dc gain is constant) is connected after a subsidiary amplifier circuit 16 (in the output terminal side). The signal gain F of the feedback amplifier circuit 12 is equivalent to a product of the do gain of the integrator 15 and gain of second amplifier circuit 16. Furthermore, the DC gain of the integrator 15 is constant. The gain of the subsidiary amplifier circuit 16 is controlled by the gain control signal Vcf.

Figure 11A:
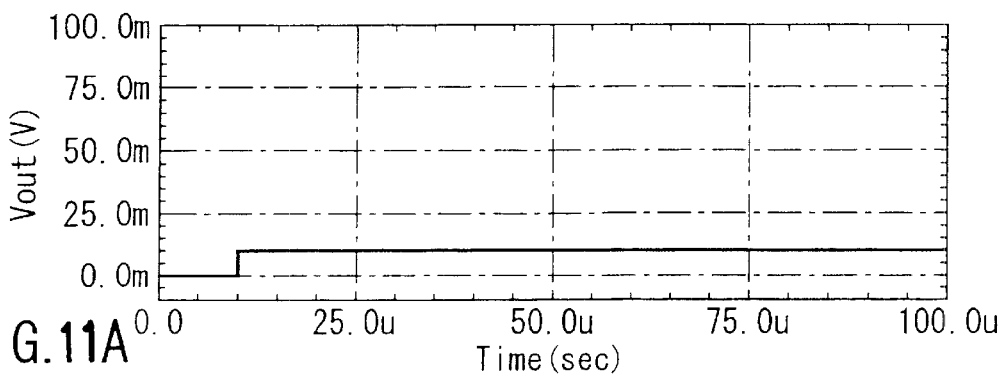
FIGS. 11A and 11B show response waveforms of the variable gain amplifier used in the feedback amplifier circuit of FIG. 2.
Figure 11B:
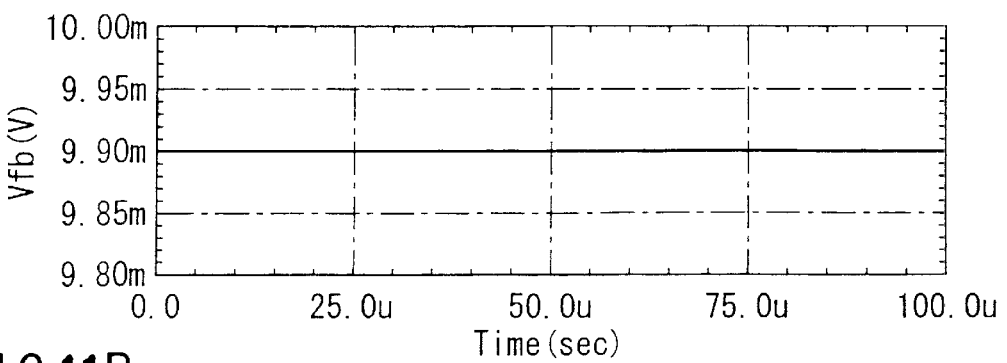

FIGS. 11A and 11B show response waveforms. The response waveforms are obtained by simulation when the gain of the variable gain amplifier using the feedback amplifier circuit 12 of FIG. 2 is changed. In other words, the input conversion offset of the main amplifier circuit 11 is supposed to be 10 mV. When the gain A is changed to 100 times (40 dB)from 1 time (0 dB), this response waveform is obtained. As is apparent from FIGS. 11A and 11B, the gain A is controlled so that A*F=100, that is, A*F becomes constant. It is obvious that from the response waveform, only the residual offset (10 mV) is displayed without a peak at Vout.

Even if F*A is not constant, if the gains F and A are complementarily controlled so that the gain F decreases when the gain A increased, a change of F*A can be reduced. As a result, drift of the error Δ can be suppressed.

Figure 12A:
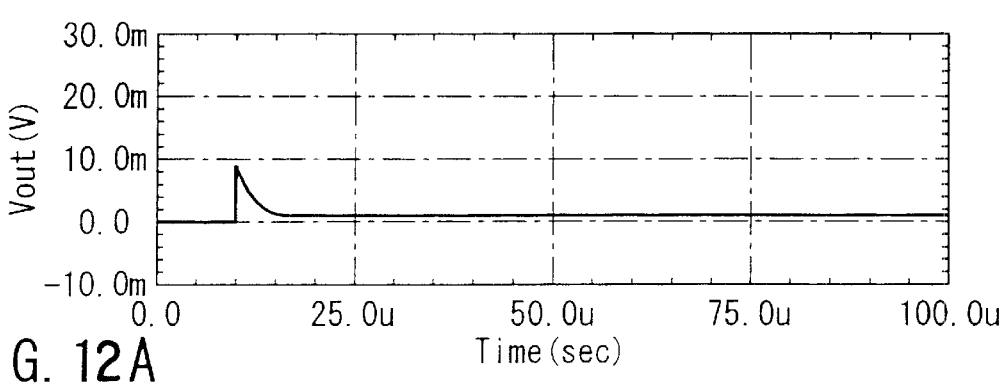
FIGS. 12A and 12B show response waveforms of a variable gain amplifier according to the first embodiment.
Figure 12B:
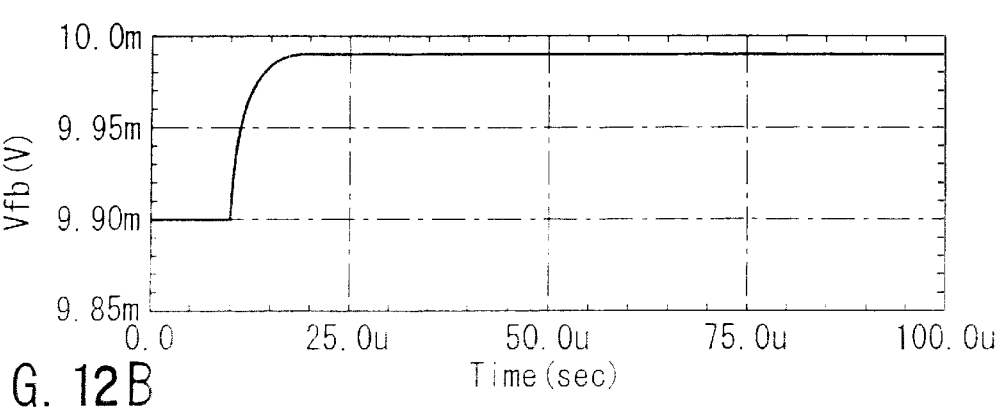

FIGS. 12A and 12B show response waveforms provided by the variable gain amplifier based on the embodiment of the present invention. FIG. 12A shows an output response waveform obtained when the gain F of the feedback amplifier circuit 12 is changed from 100 times (40 dB) to 10 times (20 dB) as well as the gain A is changed from one time (0 dB) to 100 times (40 dB), supposing that the input conversion offset of the main amplifier circuit 11 is 10 mV.

It is found from the response waveform that the error a output from the output terminal 14 is less than 10 mV. It can be confirmed in FIG. 12B that the feedback signal Vfb is delivered to a change of around 10 mV.

Figure 3:
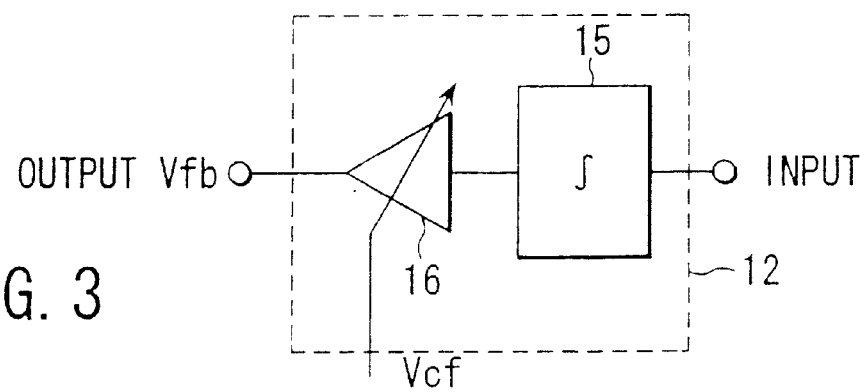
FIG. 3 shows another configuration of the feedback amplifier circuit.

FIG. 3 shows another configuration of the feedback amplifier circuit 12. This configuration is reverse to that of FIG. 2. An integrator 15 having a constant DC gain is arranged at a pre-stage, and a subsidiary amplifier circuit 16 is connected to the output of the integrator 15. Similarly to the main amplifier circuit 11, the dc-offset Voff2 occurs in the feedback amplifier circuit 12. It should be noted that the mark Voff2 is not an actual circuit. The subsidiary amplifier circuit 16 of the feedback amplifier circuit 12 generates the offset voltage Voff2, but this offset voltage Voff2 is larger than Voff1 and etc. When this offset voltage Voff2 effects to the variable gain amplifier in dominant, the circuit configuration shown in FIG. 3 is desirable. This reason is explained to the following.

Since the offset voltage Voff2 is made F times in the output of the subsidiary amplifier 16, the offset voltage in the subsidiary amplifier 16 varies depending on a change of the gain. The dc-offset Voff2 gives affect to output terminal 14 of the whole variable gain amplifier, but this affect is calculated as follows.

The output error δ due to Voff2 becomes δ=−F*A*Voff2/(1+F*A) in the output of the main amplifier circuit 11. The output voltage (Vfb=F*Voff2) of the feedback amplifier circuit 12 based on Voff2 changes depending on a change of F. Since the feedback amplifier circuit 12 provides with an integrator for extracting dc components, the output response cannot follow this change. For this reason, a change of δ appears on the output of the feedback amplifier 12 as transient response. This leads to deterioration of output signal quality.

In FIG. 2, the integrator 15 is arranged on a rear stage of the subsidiary amplifier circuit 16. However, the integrator 15 cannot follow a sudden change of input. For this reason, the transient waveform equivalent to a value obtained by amplifying by only change difference of the gain A appears on the output error δ, until the feedback signal Vfb input to the inverted input of the main amplifier circuit 11 reaches an inherent last voltage.

In a configuration of FIG. 3, since the subsidiary amplifier circuit 16 as a Voff source is arranged on the rear stage (output side) of the integrator 15, the voltage Voff2 is increased F*A times by the output of the main amplifier circuit 11. However, if the gain product F*A is controlled so as to always become constant, the output error (δ=-F*A*Voff2) based on the component of Voff2 which appears on the terminal 14 does not vary. In other words, since the output error δ supplied to the input of the integrator 15 does not vary in the FIG. 3 configuration, even if the gain varies, no transient response occurs in the output of the integrator 15. Therefore, deterioration of the output signal quality can be avoided. The possible cause of the output error Δ or δ bases on the reason that the output of the integrator built-in in the feedback amplifier circuit 12 cannot response to sudden change of the gain. Thus, a gain control signal Vcont is passed through a RC filter comprising a resistor 21 and a capacitor 22, in order to make a change of the gain control voltages Vca and Vct gentle.

In this way, by making the output response characteristic of the integrator cooperate with the gain control signal, the transient response of the output error Δ or δ can be improved more.

Figure 13:
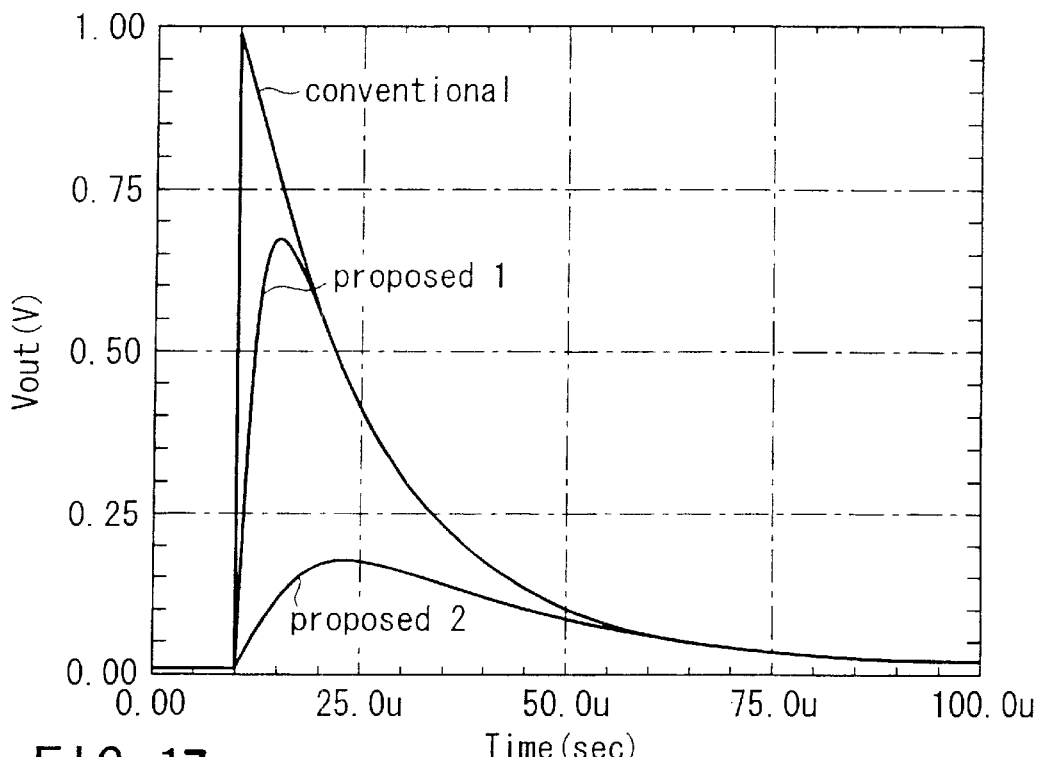
FIG. 13 shows an output response waveform of the variable gain amplifier according to the first embodiment.

When it is supposed that input conversion offsets of the main amplifier circuit 11 and subsidiary amplifier circuit 16 are 10 mV, and the gain A is changed to 100 times (40 dB) from 1 time (0 dB), the response waveform appearing on the output terminal 14 is shown in FIG. 13.

FIG. 13 shows a conventional response (conventional) obtained by changing only the gain of the main amplifier circuit 11 with the gain F of the subsidiary amplifier circuit 16 being fixed (1 time), and responses (proposed 1, proposed 2) obtained when the gain control circuit 13 is set to A*F=100 (constant) and time constant of the RC filter is set to 2 μsec or 30 μsec. In conventional result (conventional), two offset voltages cannot be suppressed and a little less than 1V transient waveform is output. On the contrary, a peak is suppressed to 700 mV in a result (proposed 1) obtained by the RC filter of the time constant 2 μsec. Furthermore, a peak is suppressed to less than 200 mV when the time constant of RC filter is increased in 30 μsec (proposed 2).

Figure 4:
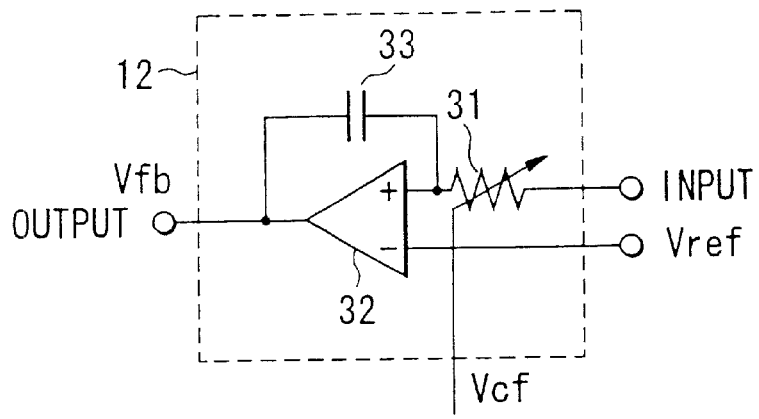
FIG. 4 shows another configuration of the feedback amplifier circuit.

FIG. 4 shows another configuration of the variable gain integrator 15. The variable gain integrator 15 comprises a variable resistor 31, an operational amplifier circuit 32 and a capacitor 33. The input voltage to the variable gain integrator 15 (output voltage of the main amplifier circuit 11 shown in FIG. 2) is converted to a current by the variable resistor 31. This current is integrated by an integrator comprising the operational amplifier circuit 32 and capacitor 33. The output voltage of this integrator is input to the inverted input of the main amplifier circuit 11 of FIG. 2 as feedback signal Vfb. The gain of the variable gain integrator 15, i.e., ratio between output voltage and input voltage is controlled by changing the resistance of the variable resistor 31 by means of the gain control circuit 13 of FIG. 2.

Figure 5:
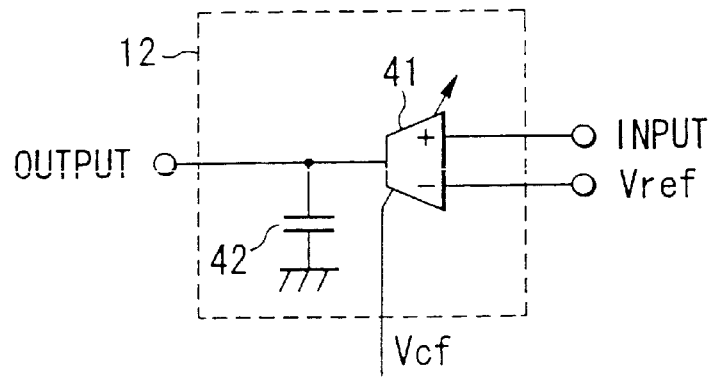
FIG. 5 shows another configuration of the feedback amplifier circuit.

FIG. 5 shows another configuration of the variable gain integrator 12. According to the integrator 12, the input voltage to the variable gain integrator 15 (i.e., output voltage of the main amplifier 11 of FIG. 2) is converted to a current by a variable mutual conductance voltage-to-current converter circuit (so-called trans-conductance circuit) 41. The converted current is integrated by a capacitor 42. The voltage between the terminals of the capacitor 42 is an output voltage of the variable gain integrator 15 and is fed back to the inverted input of the main amplifier circuit 11 as a feedback signal Vfb.

Figure 6:
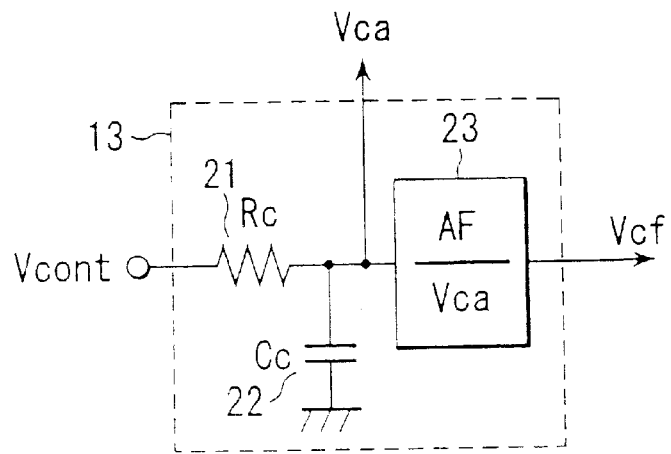
FIG. 6 shows a circuit diagram of a gain control circuit.

FIG. 6 shows a circuit structure of the gain control circuit 13 shown in FIG. 1. At first, the control signal Vcont controlling the gain of the variable gain amplifier is passed through a RC filter circuit comprising a resistor 21 and a capacitor 22. When a stepped gain control signal Vcont is input to the gain control circuit 13 in changing the gain from a first gain to a second gain, the voltage Vca gradually varying according to a time constant expressed with a product of Rc*Cc is applied to the control terminal of the main amplifier circuit 11. This voltage becomes equal to a control voltage corresponding to the second gain finally.

A RC filtered output voltage is input to an analog divider 23. The output of the divider 23 is used in the gain control signal Vcf of the feedback amplifier circuit 12. That is, the gain control signal Vcf is used for controlling the variable gain amplifier such that the product A*F of the gains of the main amplifier circuit 11 and subsidiary amplifier circuit 16 becomes constant.

As described above, even if A*F is not constant, if the gains A and F are complementarily varied, a desired effect can be obtained. In other words, when the voltage Vca is increased, the voltage Vcf is decreased, whereas when the voltage Vca is decreased, the voltage Vcf is increased. More specifically, an analog arithmetic unit that complementarily controls the voltages Vca and Vct may be used instead of the analog divider 23. The embodiment shown in FIG. 6 is explained supposing that the gain control signal Vcont is an analog signal. However, the gain control circuit 13 may be supplied with the gain control signal Vcont as a digital signal and comprise a logical circuit including a digital filter circuit and a digital-to-analog converter.

Figure 7:
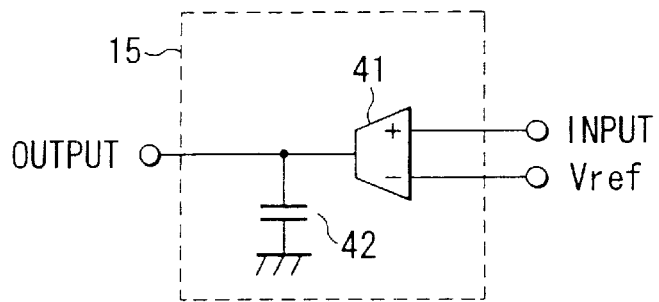
FIG. 7 shows a circuit diagram of an integrator.

FIG. 7 shows a concrete configuration of the integrator 15 used in the feedback amplifier circuit 12. The input voltage to the integrator 15 (i.e., output voltage of the main amplifier circuit 11 of FIG. 1) is converted to a current by a voltage-to-current converter 41. This current is integrated by a capacitor 42. The voltage between the terminals of the capacitor 42 becomes an output voltage of the integrator 15. This output voltage is applied to the inverted input of the main amplifier circuit 11 of FIG. 1 as the feedback signal Vfb.

Figure 8:
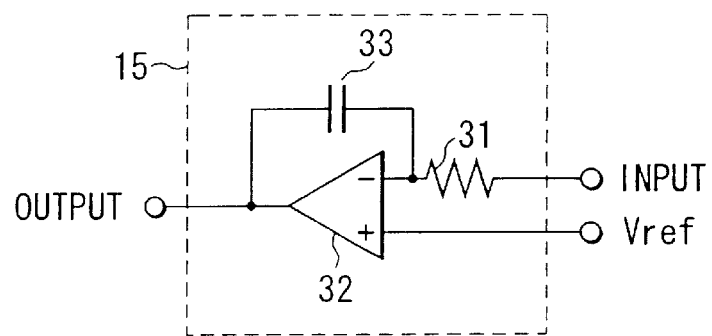
FIG. 8 shows a circuit diagram of another integrator.

FIG. 8 shows another configuration of the integrator 15 used in the feedback amplifier circuit 12. The integrator 15 comprises a resistor 31, an operational amplifier circuit 32 and a capacitor 33. The input voltage of the integrator 15 is converted to current by the resistor 31. This current is integrated by a circuit comprising the operational amplifier circuit 32 and the capacitor 33. The output voltage of the integrator 15 is applied to the inverted input of the main amplifier circuit 11 of FIG. 1 as the feedback signal Vfb. Even if a voltage-to-current converter is used instead of the resistor 31, the similar effect can be expected.

Figure 9:
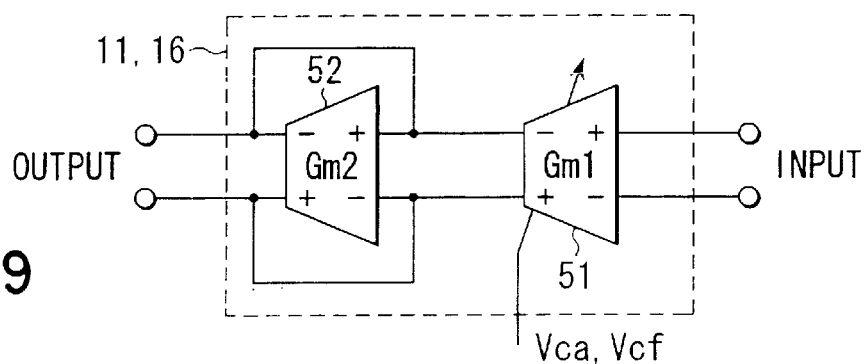
FIG. 9 shows a circuit diagram of a main amplifier circuit or a subsidiary amplifier circuit.

FIG. 9 shows a concrete configuration of main amplifier circuit 11 and subsidiary amplifier circuit 16. A variable conductance voltage-to-current converter 52 and a voltage-to-current converter whose input and output are shorted are connected in cascade. Supposing the conductance of the voltage-to-current converter 52 as Gm2, the voltage-to-current converter 52 is equivalent to a circuit including a resistor having 1/Gm2 when viewing from the output side of the voltage-to-current converter 51. If the voltage-to-current converter 52 has a conductance of Gm2, the circuit shown in FIG. 9 is equivalent to a circuit obtained by connecting a resistor having 1/Gm2 to the voltage-to-current converter 51. If the voltage-to-current converter 51 has a mutual conductance of Gm1, the voltage gain of the input and output of the circuit is Gm1/Gm2. If Gm1 can be changed by the control signal voltages Vca and Vcf, the circuit of FIG. 9 becomes a variable gain amplifier circuit.

Figure 10:
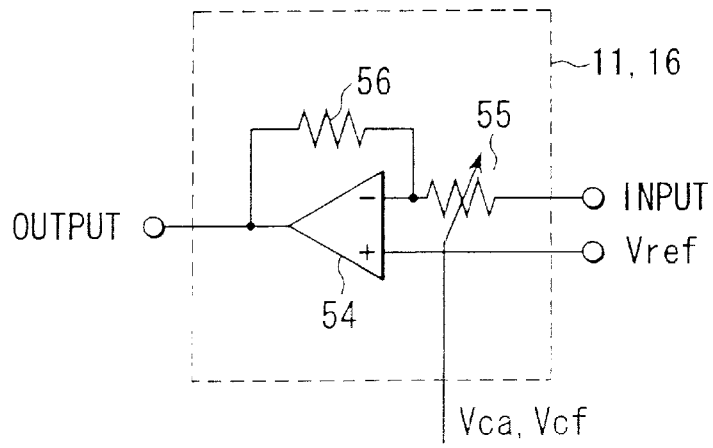
FIG. 10 shows a circuit diagram of another main amplifier circuit or another subsidiary amplifier circuit.

FIG. 10 shows another configuration of the main amplifier circuit 11 and subsidiary amplifier circuit 16. This circuit comprises a variable resistor 55, an operational amplifier 54 and a resistor 56, the resistor being controlled by the control signals Vca and Vcf. The input voltage is converted to a current by the variable resistor 55. This current is input to a feedback amplifier circuit comprising an operational amplifier 54 and a resistor 56. The output voltage of the operational amplifier 54 is output as an output of the variable gain amplifier circuit. The variable resistor 55 and resistor 56 have resistances R1 and R2 respectively. Supposing that the voltage gain of this operational amplifier 54 is sufficient large, the voltage gain of the amplifier circuit is determined by R2/R1. The variable gain can be realized by controlling the resistance R1 of the variable resistor 55 by means of the gain control signals Vca and Vcf. The variable resistor 55 may be replaced with the voltage-to-current converter 52 whose input and output are short-circuited.

Second Embodiment

Figure 14:
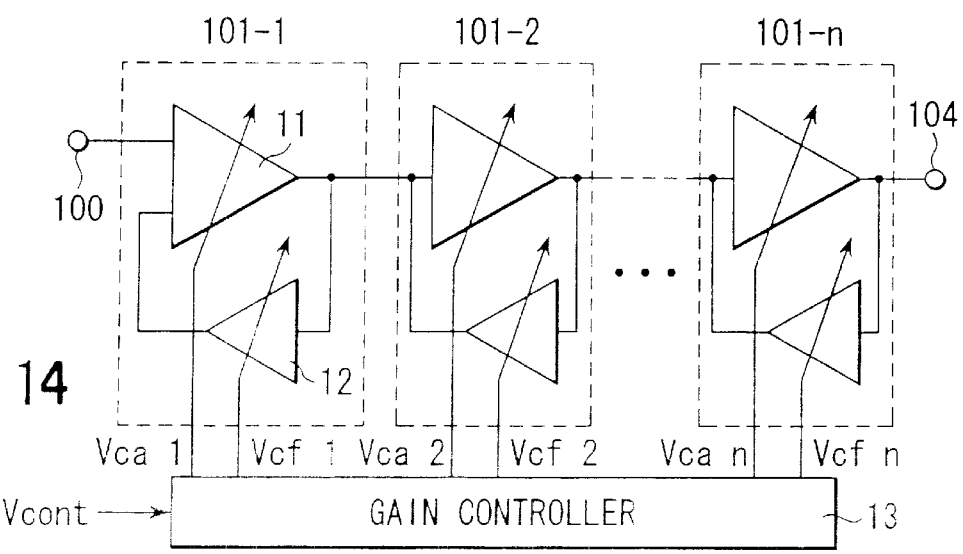
FIG. 14 shows a circuit diagram of a variable gain amplifier according to the second embodiment of the present invention.

FIG. 14 shows a variable gain amplifier according to the second embodiment of the present invention. When wanting to get a large signal gain or a large gain variable width, a plurality of feedback control loops 101-1, 101-2 . . . 101-n each comprising the main amplifier circuit 11 and feedback amplifier circuit 12 are connected in a multi-stage. When the feedback control loops 101-1, 101-2 . . . 101-n are connected in a multi-stage, a pre-stage dc-offset is amplified greatly by a rear stage feedback control loop. The dc-offset generated by the rear stage feedback control loop is applied to the pre-stage feedback control loop, and outputs to an output terminal 104. Therefore, the feedback amplifier circuit 12 is connected to the main amplifier circuit 11 for each stage in order to cancel dc-offset every stage. The gain A of the main amplifier circuit 11 and the gain F of the feedback amplifier circuit 12 are complementarily controlled by the gain control signals Vca and Vcf supplied by the gain control circuit 13. In this case, when the gain is changed, the output error Δ occurs every variable amplifier stage 101. The output errors Δ of plural stages are superposed and the superposition output error is output to an output terminal 104.

Since the output error occurred in the pre-stage amplifier circuit is increased N times by the rear-stage amplifier circuit (N is a value of gain of the rear-stage amplifier circuit), the output error of the pre-stage amplifier circuit dominates the performance of the variable gain amplifier. For this reason, when the gain is changed, a transient response occurs by the output error of the pre-stage amplifier circuit. For the purpose of suppressing the transient response, the gain control circuit 103 is devised as follows.

In other words, the delay element which gives a constant delay to the gain control signals (Vca2, Vcf2, Vcan, Vcfn) to be added to the variable gain stages 101-2 . . . 101-n after the second stage or RC filter is built-in in each gain control circuit 103. Thus, the output error Δ from the pre-stage amplifier circuit that effects largely to all the offsets is prevented from being superposed on the error Δ occurring by the rear-stage amplifier circuit. As a result, the transient response in the output terminal 104 can be decreased.

The above configuration is effective especially in a case that the delay element is built in the gain control circuit and the gain control signal Vcont is a digital signal. A sudden change of the gain control signal supplied to the amplifier circuit after the second stage is suppressed by using the RC filter shown in FIG. 6, for example, as a delay element. As a result, the gain control signal can cooperate with the slow output response of the integrator 15 and also the transient response of the output error Δ can be decreased.

Figure 15A:
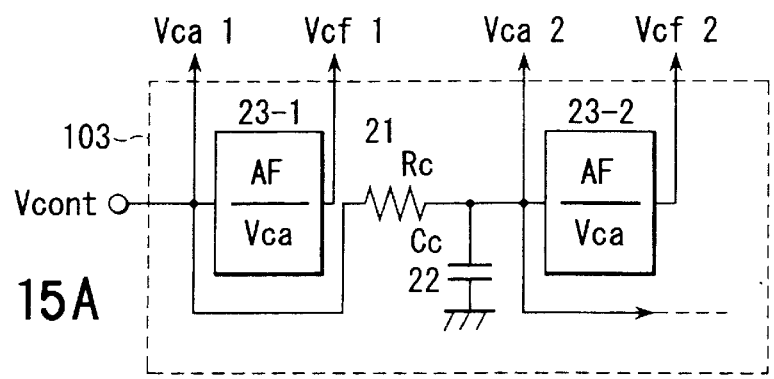
FIGS. 15A and 15B show block circuits of gain control circuits that two variable gain amplifiers are connected at a two-stage.
Figure 15B:
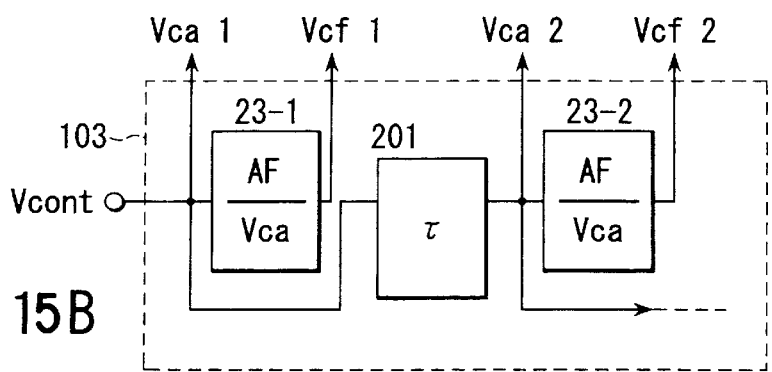

FIGS. 15A and 15B show a gain control circuit 103 used for an amplifier wherein two variable gain amplifiers are connected to each other. FIG. 15A shows a gain control circuit wherein an RC filter (comprising a resistor 21 and a capacitor 22) is arranged between gain control signal terminals Vca1 and Vca2. FIG. 15B shows a gain control circuit wherein a delay element 201 is arranged between gain control signal terminals Vca1 and Vca2.

Figure 16:
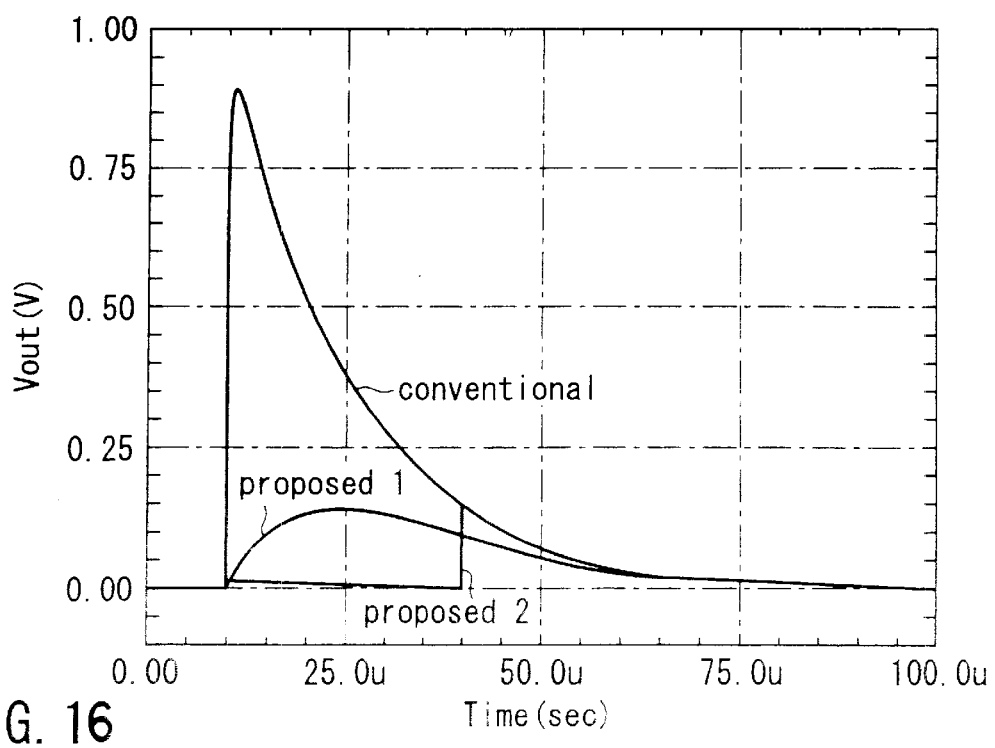
FIG. 16 shows a response waveform of the variable gain amplifier of FIGS. 15A and 15B.

FIG. 16 shows a simulation result obtained by comparing output responses when the gain is changed in the embodiment shown in FIGS. 15A and 15B. That is, FIG. 16 shows a result obtained when the dc-offset of 10 mV occurs at the main amplifier circuit 11 and the gain of each stage is changed from 1 to 100. In the result (Conventional) of the conventional art that does not use a delay element for the gain control circuit 103, a peak appears with an around 900 mV.

On the contrary, in a result (Proposed 1) of the circuit of FIG. 15A having a time constant of 30 μsec, a peak is suppressed in around 150 mV. In the circuit of FIG. 15B, the gain control signal of the second rear stage is delayed by 30 μsec from that of the first stage and supplied to the rear stage amplifier circuit. A result (Proposed 2) of the circuit of FIG. 15B is superposed on that of the circuit of FIG. 15A, and shown in FIG. 16. It is found that a transient response appears on two stages, i.e., immediately after a gain is changed and after which a delay time of 30 μsec is given to the second stage gain control signal. However, the amplitude of excess response waveform is held down to around 150 mV, the effect of the present embodiment can ensure. In this embodiment, it was described with an example wherein a delay is given to the gain control signal between the first stage and each stage after the second stage. However, a delay may be given to each of stages after the second stage.

As described above, a variable gain amplifier according to the present invention reduces an offset varied with the variation of the gain, and makes the offset stabilize in a matter of minutes. Accordingly, the present invention is suitable for a variable gain controller used for a mobile communication system that requires a high speed changing of the gain since the signal level varies at high speed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A variable gain amplifier apparatus, comprising:
    a plurality of variable gain amplifiers connected in cascade, each of the variable gain amplifiers including a main amplifier circuit whose gain is controllable and which amplifies a difference signal between an input signal and a feedback signal to output an output signal, and a feedback amplifier circuit whose gain is controllable and which amplifies the output signal and outputs the feedback signal; and
    a gain control circuit which supplies a plurality of gain control signals to the variable gain amplifiers, respectively, to complementarily control the gain of the main amplifier circuit and the gain of the feedback amplifier circuit.

2. A variable gain amplifier apparatus according to claim 1, wherein the gain control circuit includes a delay circuit configured to give a given delay time between the gain control signals to be supplied to adjacent two of the variable gain amplifiers.

3. A variable gain amplifier apparatus according to claim 1, wherein the gain control circuit includes terminals from which the gain control signals are output and a RC filter having a given time constant and connected between the terminals.

4. A variable gain amplifier apparatus according to claim 1, wherein the gain control circuit includes an arithmetic operation circuit configured to generate, based on an external gain control signal:
 a first gain control signal for the main amplifier circuit; and
 a second gain control signal for the feedback amplifier circuit;
 wherein the first gain control signal and the second control signal complimentarily control the gain of the main amplifier circuit and the gain of the feedback amplifier circuit.

5. A variable gain amplifier apparatus according to claim 1, wherein:
 the gain control circuit complimentarily controls the gain of the main amplifier circuit and the gain of the feedback amplifier circuit to obtain a constant product of the gain of the main amplifier circuit and the gain of the feedback amplifier circuit.

6. A variable gain amplifier apparatus according to claim 1, wherein the feedback amplifier circuit includes:
 a subsidiary amplifier circuit whose gain is controllable and which amplifies the output signal; and
 an integrator connected in cascade to an output side of the subsidiary amplifier to integrate an output signal of the subsidiary amplifier.

7. A variable gain amplifier apparatus according to claim 6, wherein the integrator includes:
 a voltage-to-current converter configured to convert a voltage signal of the subsidiary amplifier to a current signal; and
 a capacitor configured to integrate the current signal.

8. A variable gain amplifier apparatus according to claim 6, wherein the integrator includes:
 an operational amplifier having an inverted input terminal and an output terminal; and
 a capacitor connected between the inverted input terminal and the output terminal of the operational amplifier, to integrate the output signal of the subsidiary amplifier.

9. A variable gain amplifier apparatus according to claim 6, wherein the subsidiary amplifier includes:
 a first voltage-to-current converter whose conductance is controllable; and
 a second voltage-to-current converter whose input and output are short-circuited and which is connected in cascade to the first voltage-to-current converter.

10. A variable gain amplifier apparatus according to claim 6, wherein the subsidiary amplifier circuit includes:
 a variable resistor controlled by a gain control signal from the gain control circuit and configured to convert the output signal of the main amplifier circuit to a current signal; and
 a subsidiary feedback amplifier circuit, configured to amplify the current signal.

11. A variable gain amplifier according to claim 10, wherein the subsidiary feedback amplifier circuit includes:
 an operational amplifier; and
 a resistor connected between an input and an output of the operational amplifier.

12. A variable gain amplifier apparatus according to claim 1, wherein the feedback amplifier circuit includes:
 an integrator configured to integrate the output signal; and
 a subsidiary amplifier circuit whose gain is controllable and which is connected in cascade to an output of the integrator to amplify an output signal of the integrator.

13. A variable gain amplifier apparatus according to claim 12, wherein the integrator includes:
 a voltage-to-current converter configured to convert the output signal to a current signal; and
 a capacitor configured to integrate the current signal.

14. A variable gain amplifier apparatus according to claim 12, wherein the integrator includes:
 an operational amplifier having an inverted input terminal and an output terminal; and
 a capacitor connected between the inverted input terminal and the output terminal of the operational amplifier, to integrate the output signal.

15. A variable gain amplifier apparatus according to claim 12, wherein the subsidiary amplifier includes:
 a first voltage-to-current converter whose conductance is controllable; and
 a second voltage-to-current converter whose input and output are short-circuited and which is connected in cascade to the first voltage-to-current converter.

16. A variable gain amplifier apparatus according to claim 12, wherein the subsidiary amplifier circuit includes:
 a variable resistor controlled by the gain control signal and configured to convert the output signal of the integrator to a current signal; and
 a subsidiary feedback amplifier circuit configured to amplify the current signal.

17. A variable gain amplifier apparatus according to claim 16, wherein the subsidiary feedback amplifier circuit includes:
 an operational amplifier; and
 a resistor connected between an input and an output of the operational amplifier.

18. A variable gain amplifier apparatus according to claim 1, wherein the main amplifier includes:
 a first voltage-to-current converter whose conductance is controllable and which is supplied with the input signal and the feedback signal; and
 a second voltage-to-current converter whose input and output are short-circuited and which is connected in cascade to the first voltage-to-current converter.

19. A variable gain amplifier apparatus according to claim 1, wherein the main amplifier circuit includes:
 a variable resistor controlled by the gain control signal and configured to convert the input signal to a current signal; and
 a subsidiary feedback amplifier circuit configured to amplify the current signal.

20. A variable gain amplifier apparatus according to claim 19, wherein the subsidiary feedback amplifier circuit includes:
 an operational amplifier; and
 a resistor connected between an input and an output of the operational amplifier.

* * * * *

UNITED STATES PATENT AND TRADEMARK OFFICE
CERTIFICATE OF CORRECTION

PATENT NO. : 6,577,188 B2  Page 1 of 1
DATED : June 10, 2003
INVENTOR(S) : Takashi Ueno et al.

It is certified that error appears in the above-identified patent and that said Letters Patent is hereby corrected as shown below:

Title page,
Item [56], References Cited, OTHER PUBLICATIONS, add:
-- J. Jussila et al., Proc. Of ESSCIRC'00, pp. 236-239, "A Channel Selection Filter for A WCDMA Direct Conversion Receiver", Sep. 2000.

R.J. Wiegerink, et al., IEEE Journal of Solid-State Circuits, Vol. 24, No. 3, pp. 651-658, "Offset Cancelling Circuit", Jun. 1989. --

Signed and Sealed this

Twenty-seventh Day of April, 2004

JON W. DUDAS
*Acting Director of the United States Patent and Trademark Office*